(12) United States Patent
Mandl et al.

(10) Patent No.: US 12,200,883 B2
(45) Date of Patent: Jan. 14, 2025

(54) DEVICE FOR ACCOMMODATING A COMPONENT

(71) Applicant: Continental Automotive Technologies GmbH, Hannover (DE)

(72) Inventors: Siegfried Mandl, Schierling (DE); Antje Steinmüller, Tegernheim (DE)

(73) Assignee: Continental Automotive Technologies GmbH, Hannover (DE)

( * ) Notice: Subject to any disclaimer, the term of this patent is extended or adjusted under 35 U.S.C. 154(b) by 359 days.

(21) Appl. No.: 17/795,849

(22) PCT Filed: Dec. 17, 2020

(86) PCT No.: PCT/EP2020/086712
§ 371 (c)(1),
(2) Date: Jul. 27, 2022

(87) PCT Pub. No.: WO2021/151586
PCT Pub. Date: Aug. 5, 2021

(65) Prior Publication Data
US 2023/0067747 A1 Mar. 2, 2023

(30) Foreign Application Priority Data

Jan. 28, 2020 (DE) ..................... 10 2020 200 979.1

(51) Int. Cl.
*H05K 5/02* (2006.01)
*H05K 5/00* (2006.01)

(52) U.S. Cl.
CPC ......... *H05K 5/0221* (2013.01); *H05K 5/0086* (2013.01)

(58) Field of Classification Search
CPC .. H05K 5/0295; H05K 5/0013; H05K 5/0017; H05K 5/0221; H05K 5/0217;
(Continued)

(56) References Cited

U.S. PATENT DOCUMENTS 3,747,379 A   7/1973 Cabanes
6,765,311 B1 * 7/2004 Labonde ............ G07C 9/00944
                                                   70/400
(Continued)

FOREIGN PATENT DOCUMENTS

CN          201152097        11/2008
CN          101998915 A       3/2011
(Continued)

OTHER PUBLICATIONS

Search Report dated Feb. 20, 2024 from corresponding Chinese patent application No. 202080094986.7.
(Continued)

*Primary Examiner* — Golam Sorowar

(57) ABSTRACT

A device for accommodating a component in an interior space has a housing comprising a housing wall delimiting the interior space of the housing, and a passage portion in the wall. The component comprises a sensing element with an actuating portion, and a holding portion mechanically connected to said actuating portion and has at least one latching hook with a latching lug. The component has a holder with a latching edge. When the component is accommodated in the interior space, the actuating portion, in a first state, is arranged in the passage portion, and, to reach a second state with the actuating portion in the interior space, is displaceable into the interior space so the latching lug of the latching hook engages over the latching edge. The latching connection so created prevents the actuating portion from being displaced in the direction of the passage portion, and enables damage-free removal.

19 Claims, 3 Drawing Sheets

(58) Field of Classification Search
CPC ......... B60R 2011/0071; B60R 11/0241; B60R 11/02; B60R 2011/0073; B60R 2011/0047; B60R 2011/0078
See application file for complete search history.

(56) References Cited

U.S. PATENT DOCUMENTS

| | | | | |
|---|---|---|---|---|
| 2006/0253711 | A1* | 11/2006 | Kallmann | B60R 25/252 713/186 |
| 2011/0084856 | A1 | 4/2011 | Kleindienst et al. | |
| 2016/0267728 | A1* | 9/2016 | Saito | G07C 9/20 |
| 2017/0031109 | A1* | 2/2017 | Meadowcroft | G02B 6/4277 |
| 2020/0031311 | A1* | 1/2020 | Farah | B60R 25/252 |

FOREIGN PATENT DOCUMENTS

| | | | |
|---|---|---|---|
| CN | 102602595 A | 7/2012 | |
| CN | 105164560 A | 12/2015 | |
| CN | 106405751 | 2/2017 | |
| CN | 104948013 B | 11/2018 | |
| DE | 3719792 C1 | 8/1988 | |
| DE | 102006031727 A1 * | 1/2007 | ......... G07C 9/00944 |
| EP | 1496175 A1 | 1/2005 | |
| EP | 1750230 A2 | 2/2007 | |
| JP | 2011042989 A * | 3/2011 | |
| KR | 20080067899 | 7/2008 | |
| WO | 2004020769 | 3/2004 | |

OTHER PUBLICATIONS

Office Action dated Feb. 20, 2024 from corresponding Chinese patent application No. 202080094986.7.
Office Action dated Sep. 16, 2020 from corresponding German patent application No. 10 2020 200 979.1.
International Search Report and Written Opinion dated Apr. 29, 2021 from corresponding International patent application No. PCT/EP2020/086712.

* cited by examiner

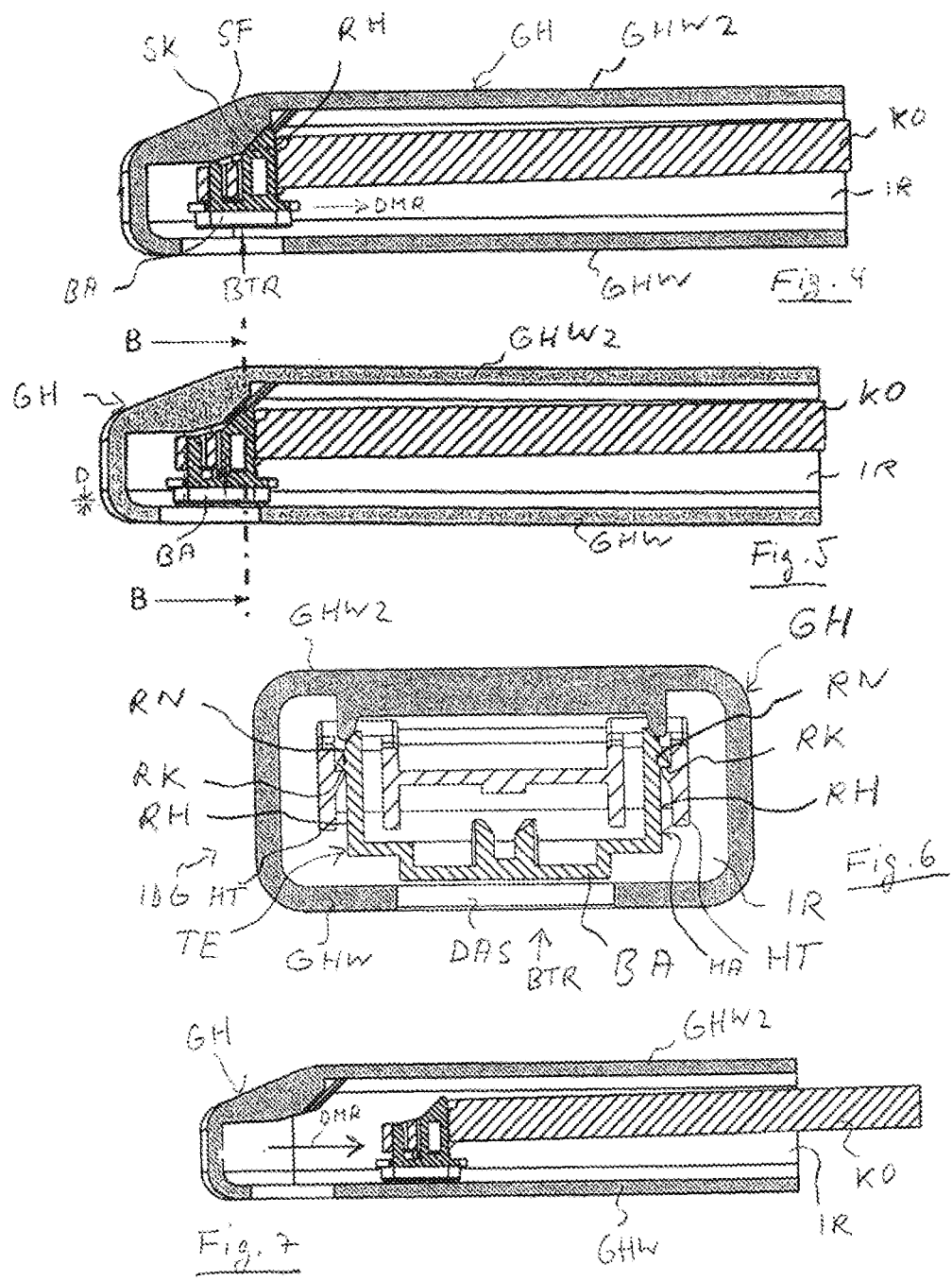

DEVICE FOR ACCOMMODATING A COMPONENT

The present invention relates to a device for accommodating a component, in particular it relates to a portable device, such as a radio key for a vehicle, with a housing in which a component, in particular with functional elements, can be accommodated.

In order to prevent unauthorized access to a vehicle, in particular a motor vehicle, modern access devices in vehicles use electronic security systems in which, to authenticate a user, data communication is carried out, in particular via a radio interface, between a first on-board communication device (an on-board control unit with a corresponding antenna) and a second communication device in a mobile identification transmitter of a user, such as a radio key or vehicle key. If the identification code is correctly transmitted from the mobile identification transmitter to the vehicle, a specific vehicle door or all the vehicle doors can be locked or unlocked.

The mobile identification transmitter uses a battery as the energy source for the exchange of radio signals between the mobile identification transmitter and the on-board communication device, said battery having to be repeatedly exchanged during the operating period of the associated access device, in particular if radio communication is frequent. It is conceivable here for the mobile identification transmitter to have at least two parts, with a functional element, such as a battery holder with an associated battery, being mounted on one part, while the second part in the form of a protective housing can be arranged and fixed over the functional element on the first part. Depending on the design of the first and the second part, it can be a challenge to remove the two parts in such a way that the two parts remain undamaged, particularly in their visible regions.

It is therefore the object of the present invention to provide a possibility of creating a device which consists of two parts and which is safely removable in a simple manner.

This object is achieved by the subject matter of claim 1. Advantageous refinements are the subject matter of the dependent claims.

According to one aspect of the invention, a device for accommodating a component is therefore provided. In this case, the device first of all comprises a housing which comprises a housing wall, which delimits an interior space of the housing, and a passage portion in the housing wall. Said passage portion can be used in particular to form a passage aperture from the outside of the housing into the interior space. Furthermore, the device has the already mentioned component which is to be accommodated in the interior space. Said component comprises a sensing element with an actuating portion, in particular for actuation by a user, and comprises a holding portion which is operatively connected (in particular mechanically connected) to the actuating portion and which has at least one latching hook with a latching lug. Furthermore, the component has a holder, with respect to which the sensing element is movable and which has a latching edge. The holder can be used to hold the sensing element and/or to guide a movement of the sensing element. When the component is accommodated in the interior space, the actuating portion of the sensing element is then in a first state whenever it is at least partially arranged in the passage portion of the housing wall. In this way it is prevented from being able to be displaced in the plane of the housing wall. Accordingly, the component cannot be displaced either, and therefore it is fixed in the housing. To reach a second state of the actuating portion of the sensing element, in which the actuating portion of the sensing element is located completely in the interior space, the actuating portion is displaceable into the interior space in such a way that the latching lug, which is mechanically connected thereto, of the at least one latching hook engages over the latching edge of the holder and forms a latching connection. The latching connection that is created as a result can prevent the actuating portion of the sensing element from being displaced in the direction of the first state, i.e. back into the passage portion of the housing wall. It is advantageous in this case to arrange the height of the latching edge in such a way that the sensing element or the actuating portion is held at a certain distance from the housing wall via the latching lug in the latched state. In this way, the component can be safely removed from the housing, and both parts can be kept undamaged during the removal.

According to an advantageous refinement, the device furthermore has a spring element which is designed in such a way as to pretension the sensing element in a direction from the interior space to the outside of the housing. In particular, the pretensioning can take place in the direction of the first state of the actuating element, in which the latter is located in the passage portion of the housing wall. In this way, unintentional removal of the device is prevented.

According to a further refinement of the device, the spring element can be fixed in the holder in such a way in order therefore to act on the sensing element from the holder.

According to a further refinement, the holding portion of the sensing element furthermore has an oblique edge. This can be arranged, for example, on the at least one latching hook, and in particular in the region of the latching lug there. Furthermore, the housing can have an abutment portion in the interior space, in particular on a side opposite the passage portion. When the sensing element is displaced from the first into the second state (i.e. from the passage portion in the direction of the interior space), the oblique edge of the holding portion strikes against the abutment portion and slides along the latter in such a way that the sensing element undergoes a movement, which is perpendicular to the displacement direction of the actuating portion (from the first state into the second state), in a removal direction. Upon this movement in the removal direction, the component moves out of the interior space. In this way, firstly the unlocking process is carried out by actuating the actuating portion, and a first sub-step of decoupling from the housing and the component accommodated therein is immediately initiated. As will be explained later, this displacement of the sensing element in a direction perpendicular to the actuation direction when the actuating portion is actuated may also be advantageous during the installation.

According to one refinement of the abutment portion in the interior space of the housing, said abutment portion can be designed as an oblique surface or can have an oblique surface along which the oblique edge of the holding portion slides.

According to a further refinement, the at least one latching hook has a second oblique edge perpendicular to the displacement direction of the sensing element (from the first into the second state of the actuating portion). In this case, the second oblique edge is aligned or effective in said removal direction or in a direction opposed thereto. In addition, the housing has at least one projection in the interior space. When the component moves into the interior space, i.e. in an installation direction that runs in a direction opposed to the removal direction, the projection of the housing will come into contact with the second oblique edge of the latching hook and, during the movement, will push the latching lug of the latching hook in order to release the latching connection from the latching edge. Thus, the second oblique edge serves to use the movement of the housing in the installation direction by coming into contact with the projection of the housing to displace the latching lug in a direction perpendicular to the installation direction.

According to a further refinement, the holder of the component has at least one guide element for guiding the movement of the sensing element. Correspondingly, the sensing element can have at least one projection as a corresponding guide part, which then comes into contact or operative connection with the at least one guide element for safe and targeted guiding. In particular, the at least one guide element can be embodied as a rail on which the projection of the sensing element or of the associated holding portion is guided.

According to a further refinement, the component has functional elements. These can be mechanical or electrical or electronic functional elements. For example, the functional elements can comprise a battery holder or an emergency key holder. These functional elements of the component are thus protected in the mounted state by the housing of the device. If a user needs to access a functional element, for example because they want to replace a battery in the battery holder of the component, or if they want to remove an emergency key from the emergency key holder, the above-described structure of the device allows the device to be opened and removed easily and safely.

According to one refinement, the device is designed as a portable device. In particular, it can be designed as a remote control. It is also conceivable for it to be designed as a radio key for a vehicle.

Exemplary embodiments of the present invention will now be explained in greater detail below with reference to the accompanying drawings, in which:

FIG. 4 shows the sectional view of FIG. 3, in which a sensing element on the underside of the housing is being actuated for removal purposes;

FIG. 5 shows the sectional view of FIG. 4 after actuation of the sensing element;

FIG. 6 shows a section through the housing or the component accommodated therein, viewed in the direction of the arrows B in FIG. 5;

FIG. 7 shows a removal state of the sectional view of FIG. 5;

Figure 1:
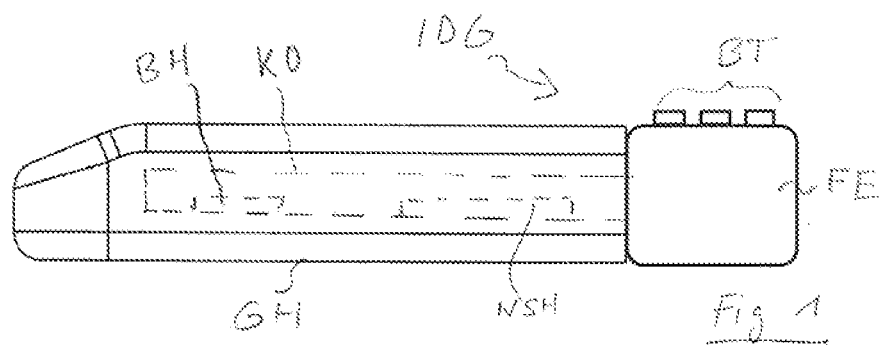
FIG. 1 shows a schematic illustration of a device for accommodating a component according to an embodiment of the invention in a view from the side.

Reference is first made to FIG. 1, which shows a schematic illustration of a device IDG according to an embodiment of the invention, here as a portable device, in particular in the form of a radio key for a vehicle. Said radio key IDG has a functional unit FE, which has a component KO to be protected. This is shown in dashed lines in the figure since it is not visible from the outside. The functional unit FE and/or the component KO to be protected can have various functional elements; in particular, the component KO can comprise a printed circuit board on which a wide variety of electrical and electronic components or also mechanical components are arranged. For example, a battery holder BH for accommodating a battery as an energy source and/or an emergency key holder NSH for accommodating a mechanical emergency key for a vehicle access system assigned to the radio key can be arranged on the component KO.

The functional unit FE can also have a communication device for radio communication with an associated on-board communication device of an access system. By means of the buttons BT, a user, by appropriate actuation, can cause a radio signal to be sent from the functional unit FE to the vehicle, wherein, by pressing a specific button, a specific command is transmitted to the vehicle, for example to lock the doors, to unlock the doors, to switch on the panic mode, to close or to open a window, or to open or to close the tailgate, etc.

To protect the component KO and its functional elements, the radio key IDG also comprises a housing GH, which has an interior space in which the component KO can be placed.

Figure 2:
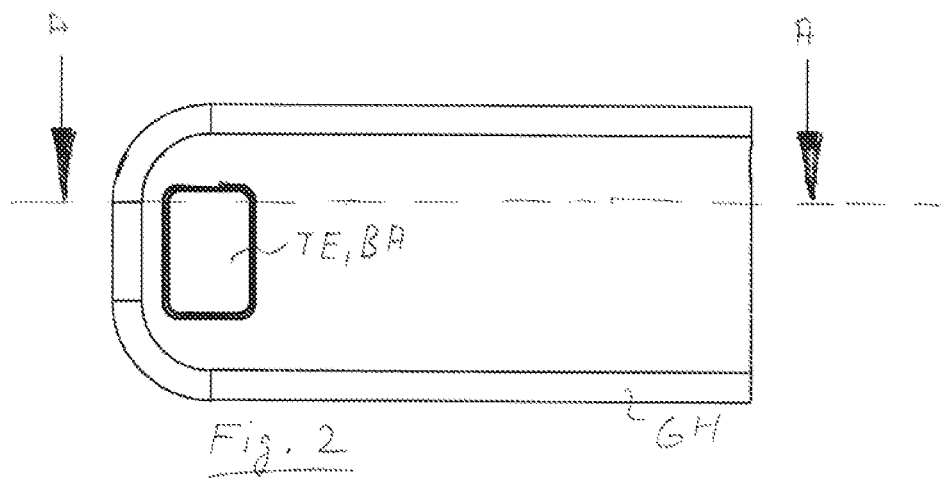
FIG. 2 shows a bottom view of a housing of the view shown in FIG. 1.

Since the block indicated by FE is not necessary for the following description, it is omitted in the following for a clearer illustration. FIG. 2 therefore shows a bottom view of the housing illustrated in FIG. 1. A passage portion DAS (see more precisely in FIG. 3) can be seen on the underside of the housing GH, in which an actuating portion BA of a sensing element TE is arranged. For an improved illustration of the functional components for realizing an embodiment of the invention, a sectional view of the housing shown in FIG. 2 will now be taken, looking from the direction of the arrows A.

Figure 3:
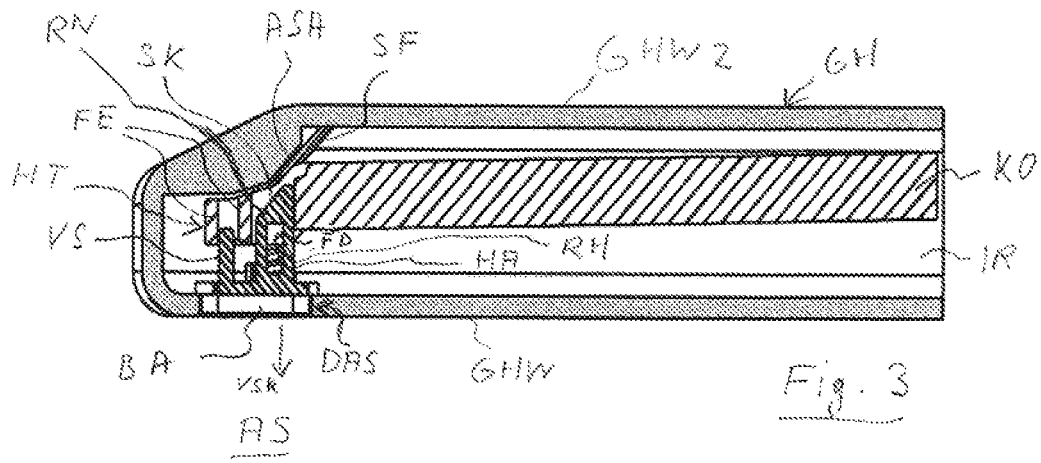
FIG. 3 shows a section through the housing of the device according to FIG. 2, viewed in the direction of the arrows A, in a mounted state.

Such a sectional view is illustrated in FIG. 3, which shows a first state of the sensing element TE or of the actuating portion BA of the sensing element, in which it is located in the passage portion DAS. As can be seen in FIG. 3, the housing GH comprises a housing wall GHW (at the bottom in the figure) and a further housing wall GHW 2 (at the top in the figure). The two housing walls delimit an interior space IR of the housing GH. Said interior space extends from right to left in the figure and is used to accommodate the component KO. As will be explained in more detail in the following figures, the interior space of the housing (on the left in the figure) comprises an abutment portion ASA, which comprises an oblique surface SF. In this case, the abutment portion ASA is arranged opposite the passage aperture DAS.

Reference is now made to the component KO, which has a holder HT on one side (on the left in the figure), which is used on the one hand to hold and on the other hand to guide a movement of the sensing element. Guide elements FE can be seen in FIG. 3, said guide elements guiding a projection VS or pin of the holding portion HA of the sensing element in a linear movement (from bottom to top in the figure, or vice versa).

The sensing element TE already mentioned in FIG. 2 comprises an actuating portion BA which, as already described in FIG. 2, in this (first) state is located specifically in the passage portion DAS of the housing wall GHW. Furthermore, the sensing element TE comprises the holding portion HA just mentioned, which is used here in the embodiment to hold and guide a movement of the sensing element TE in cooperation with the holder HT. In addition to the projection VS already mentioned for the purpose of guiding a movement, the holding portion HA also has a latching hook RH, on the end of which facing away from the actuating portion a latching lug RN is provided. These first-mentioned elements can be seen in a more detailed illustration in FIG. 6. The actuating portion BA and the holding portion HA are mechanically operatively connected or, as in the embodiment shown here, are mechanically connected to one another. In particular, the holding portion and the actuating portion can be formed in one piece.

Finally, the component KO has a spring element FD, which is designed in such a way as to pretension the sensing element TE in a direction VSR from the interior space to the outside of the housing, in particular in order to hold the actuating portion BA in the passage portion DAS. The spring element FD is fixed in the holder in such a way that from there it can exert a force on the sensing element TE in said direction.

Reference is now made to FIG. 4, which again shows the sectional view from FIG. 3, with a user now wishing to remove the component KO from the housing GH. To do this, they press (bottom left in the figure) on the actuating portion BA and displace same in a direction BTR from the passage portion DAS in the direction of the interior space IR. As will also be explained below with reference to FIGS. 5 and 6, this upward displacement of the actuating portion BA and thus of the entire sensing element TE causes the sensing element to be fixed in place. Furthermore, when the sensing element TE is displaced in the direction of the arrow BTR, the oblique edge SK of the latching hook RH comes into contact with the oblique surface SF of the housing GH or the housing wall GHW2, such that the sliding of the two oblique surfaces on one another causes the vertical displacement in the figure along the arrow BTR to furthermore be converted into a horizontal movement in the direction of the arrow DMR with respect to the sensing element and thus also the component KO. Thus, by actuating the actuating portion BA along the arrow BTR, the housing component structure is unlocked on the one hand, since now, owing to the fact that the actuating portion BA is no longer located in the passage portion DAS of the housing wall GHW, there is no longer a form fit (also possibly no frictional connection) between the actuating portion and the housing wall and the sensing element TE can therefore move in the direction of the arrow DMR. On the other hand, as can also be seen in the right-hand section of the figure, this conversion of the vertical movement through contact of the oblique edge SK with the oblique surface SF already initiates a first portion of a removal movement, in which the component KO is moved by a certain distance out of the interior space IR.

Reference is now made to FIG. 5, where it is shown that, starting from FIG. 4, the user has removed their compressive force, and the spring element FD attempts to press the actuating portion BA downward again in the figure. As described above, by displacing the actuating portion BA or the entire sensing element upward, the sensing element TE is fixed to the holder HT such that the actuating portion is now at a predetermined distance D away from the housing wall GHW. In this way, the component KO cannot come into contact with the housing during the removal, and thus the likelihood of damage to the surface of the actuating portion is minimized, if not eliminated.

Reference is now made to FIG. 6, in which a sectional view of FIG. 5, viewed in the direction of the arrows B, is shown to explain how the sensing element TE is fixed to the holder HT. In addition to the elements already mentioned above, the holding portion HA of the sensing element TE here in the figure comprises two latching hooks RH on the left and right side, which are connected to the actuating portion BA at the lower end and have a respective latching lug RN on an opposite upper portion.

The removal is viewed once again from the state of FIG. 3, when the actuating portion BA or the entire sensing element TE moves in a direction along the arrow BTR, the latching lugs RN of the elastically designed latching hooks (from bottom to top in the figure) are pushed over a respective latching edge RK of the holder HT. During the movement, the latching hooks RH bend in the direction of the center of the figure and then relax again when the respective latching lugs RN are located above the respective latching edges RK. In particular, the respective latching lugs RN then come into contact with (overlap) the latching edges RK when the spring element FD presses the sensing element downward in a direction opposed to the direction BTR in the figure after the user has removed a force. The latching connection thus created between the respective latching lugs RN and the latching edges RK prevents the sensing element from moving further downward and, as explained in FIG. 5, holds the actuating portion in a second state in a section D away from the housing wall GHW.

In this way it is thus easily possible to remove the component KO in the direction of the arrow DMR by one movement (to the right in the figure) from the housing GH, as is shown in FIG. 7. After the components have been completely removed from the interior space IR of the housing GH, the functional elements BH or NSH can then be accessed, as has been briefly indicated in FIG. 1.

Figure 8:
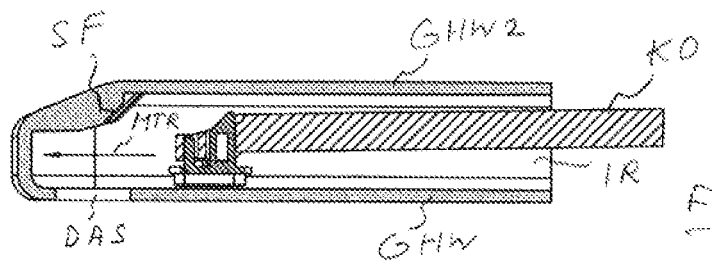
FIG. 8 shows the sectional view of FIG. 7 to explain the process of installing the component in the housing.

Reference is now made to FIG. 8, in which an installation process is being shown, in which the radio key removed in FIG. 7 is being reassembled. As shown in FIG. 8, the component KO is introduced into the interior space IR and moved along the installation direction MTR (to the left in the figure).

Figure 9:
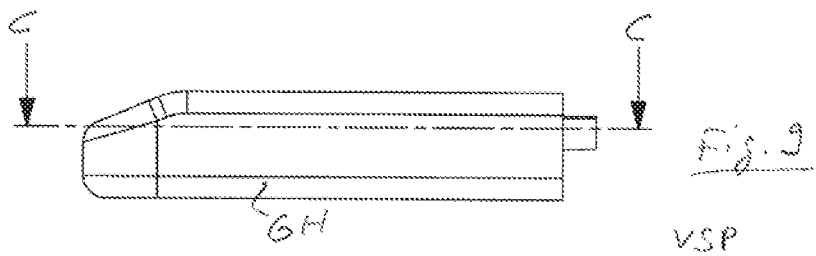
FIG. 9 shows a schematic side view to identify a section for the following views.

To better illustrate this installation process, as illustrated in FIG. 9, a corresponding section has been taken through the housing GH, which is viewed along the arrows C.

Figures 10A, 10B:
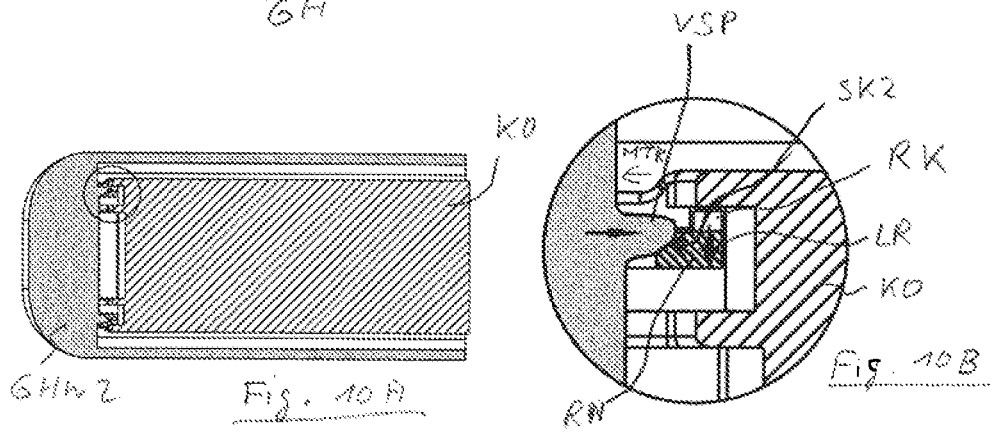
FIG. 10 shows a first section of the process of installing the component on the housing, with FIG. 10B showing an enlarged section identified in FIG. 10A.

Correspondingly, a corresponding sectional illustration according to FIG. 9 is now shown in FIGS. 10A and 10B, with FIG. 10B illustrating an enlarged section which is marked in FIG. 10A.

As can be seen in both FIGS. 10, during the installation the component KO moves in the direction of the arrow MTR (the installation direction) in the direction of the left portion of the housing wall GHW2. From the point of view of the component KO as a reference system, a projection VSP correspondingly moves in the interior space of the housing GH or of the housing wall GHW2 in a direction opposed to the installation direction MTR (indicated by an arrow pointing to the right in FIG. 10B). As can also be seen in FIG. 10B, the latching lug, which is illustrated in detail in FIG. 6, has a second oblique edge SK2 in the installation direction or in a plane in which the installation direction lies. After the projection VSP of the housing wall GHW2 has come into contact with the second oblique edge SK2, the projection VSP slides with the opposite movement together with the component KO along the second oblique edge SK2 of the latching lug RN. Since the projection VSP is designed to be stable or stationary whereas the latching lug RN is held by an elastically designed latching hook RH, the projection VSP and the second oblique edge SK2, by sliding against each another, cause the latching lug to move in a direction LR perpendicular to the installation direction MTR (downward in the figure). This movement disengages the latching lug RN from the latching edge RK of the holder HT.

Figures 11A, 11B:
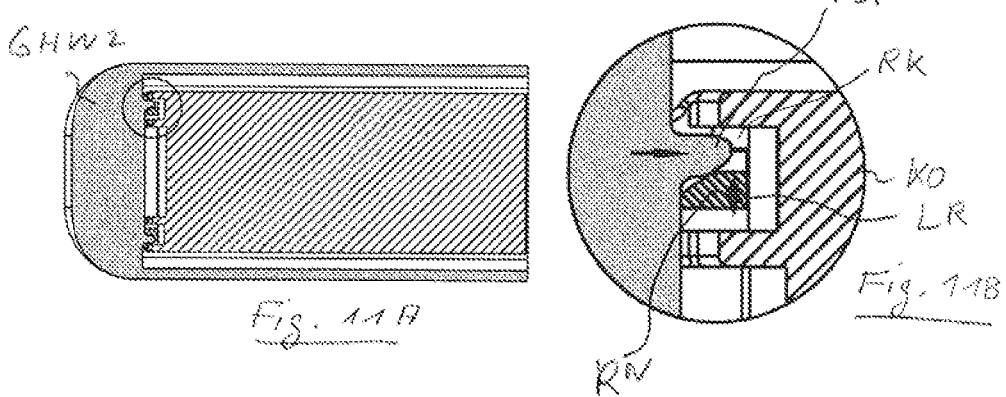
FIG. 11 shows a second section of the process of installing the component on the housing, with FIG. 11B again showing an enlarged section identified in FIG. 11A.

Reference is now made to both of FIGS. 11, which show how, after a further movement of the component KO in the installation direction MTR, the projection VSP has completely released the latching lug RN from the latching edge RK. In such a state, it is then possible for the sensing element TE or the associated actuating portion BA to be moved in the direction of the housing wall GHW in order to therefore be arranged again in the passage portion DAS, in particular by the pretensioning of the spring element FD, as has been shown in accordance with the first state of the actuating portion BA in FIG. 3.

However, before the sensing element can move into the passage portion DAS after release of the latching connection between the latching lug RN and the latching edge RK, the oblique edge SK of the holding portion HA of the sensing element is again in contact with the oblique surface SF, particularly in the stage shown in both FIGS. 11, of the housing GH and, when the component KO moves in the installation direction MTR, the sensing element is not only moved forward by the sliding movement between the oblique edge SK and the oblique surface SF, but also in a direction perpendicular thereto in the direction of the passage portion DAS.

While FIGS. 10 and 11 only show the release mechanism of the respective latching lug from the latching edge RK with reference to the latching connection illustrated at the top in the figure, a corresponding release of the latching connection illustrated at the bottom in the figure takes place in the same way.

In this way, both when removing and when installing the component KO in the housing GH, visual damage in particular to the sensing element (more precisely, to the actuating portion) is prevented, and processes that have to be carried out frequently, such as changing a battery or removing an emergency key, leave no traces on the visible parts of the radio key IDG.

The invention claimed is:

1. A device for accommodating a component, comprising:
    a housing comprising:
        a housing wall, which delimits an interior space of the housing, and
        a passage portion in the housing wall,
    the component to be accommodated in the interior space comprising:
        a sensing element with an actuating portion and a holding portion which is mechanically connected to said actuating portion and which has at least one latching hook with a latching lug, and
        a holder, with respect to which the sensing element is movable and which has a latching edge,
    wherein, when the component is accommodated in the interior space,
        the actuating portion of the sensing element, in a first state, is arranged in the passage portion of the housing wall, and
        to reach a second state, wherein the actuating portion of the sensing element is located in the interior space, is displaceable into the interior space so that the latching lug of the at least one latching hook engages over the latching edge of the holder to form a latching connection.

2. The device as claimed in claim 1, which furthermore has a spring element which is configured to pretension the sensing element in a direction from the interior space to outside of the housing.

3. The device as claimed in claim 2, wherein the spring element is fixed in the holder in order to act on the sensing element from there.

4. The device as claimed in claim 2, wherein the spring element is fixed in the holder in order to act on the sensing element from there,
    wherein the holding portion of the sensing element furthermore has an oblique edge, and
    wherein the housing has an abutment portion in the interior space on a side opposite the passage portion, and when the sensing element is displaced from the first into the second state, the oblique edge, after being brought into contact with the abutment portion, slides along the abutment portion so that the sensing element undergoes a movement, which is perpendicular to a displacement direction, in a removal direction.

5. The device as claimed in claim 4, wherein the abutment portion is configured to be an oblique surface along which the oblique edge of the holding portion can slide, wherein the at least one latching hook has a second oblique edge perpendicular to a displacement direction of the sensing element,
    wherein the housing has at least one projection in the interior space, and
    wherein, when the component moves in a direction opposed to a removal direction in the interior space, the at least one projection comes into contact with the second oblique edge of the at least one latching hook, and, during the movement, the latching lug moves away from the latching edge to release the latching connection.

6. The device as claimed in claim 5, wherein the holder has at least one guide element for guiding movement of the sensing element,
    wherein the holding portion of the sensing element has, for the at least one guide element, at least one corresponding guide part which is operatively connected thereto.

7. The device as claimed in claim 6, wherein the device is configured to be a portable device.

8. The device as claimed in claim 6, wherein the portable device is configured to be a radio key for a vehicle.

9. The device as claimed in claim 6, wherein the component has functional elements, and the functional elements comprise at least one of a battery holder and an emergency key holder.

10. The device as claimed in claim 9, wherein the device is configured to be a portable device.

11. The device as claimed in claim 9, wherein the portable device is configured to be a radio key for a vehicle.

12. The device as claimed in claim 1, wherein:
    the holding portion of the sensing element furthermore has an oblique edge, and
    the housing has an abutment portion in the interior space on a side opposite the passage portion,
    and when the sensing element is displaced from the first into the second state, the oblique edge, after being brought into contact with the abutment portion, slides along the abutment portion so that the sensing element undergoes a movement, which is perpendicular to a displacement direction, in a removal direction.

13. The device as claimed in claim 12, in wherein the abutment portion is designed as an oblique surface along which the oblique edge of the holding portion can slide.

14. The device as claimed in claim 1, wherein:
the at least one latching hook has a second oblique edge perpendicular to a displacement direction of the sensing element, and
the housing has at least one projection in the interior space,
wherein, when the component moves in a direction opposed to a removal direction in the interior space, the at least one projection comes into contact with the second oblique edge of the at least one latching hook, and, during the movement, the latching lug moves away from the latching edge to release the latching connection.

15. The device as claimed in claim 1, wherein the holder has at least one guide element for guiding movement of the sensing element.

16. The device as claimed in claim 15, wherein the holding portion of the sensing element has, for the at least one guide element, at least one corresponding guide part which is operatively connected thereto.

17. The device as claimed in claim 1, wherein the component has functional elements, and the functional elements comprise at least one of a battery holder and an emergency key holder.

18. The device as claimed in claim 1, wherein the device is configured to be a portable device.

19. The device as claimed in claim 18, wherein the portable device is a radio key for a vehicle.

\* \* \* \* \*